United States Patent
Polk

(10) Patent No.: US 10,171,024 B2
(45) Date of Patent: Jan. 1, 2019

(54) SOLAR ENERGY COLLECTOR

(71) Applicant: Steven Polk, West Bloomfield, MI (US)

(72) Inventor: Steven Polk, West Bloomfield, MI (US)

(73) Assignee: DIVERSIFIED SOLAR SYSTEMS, LLC, Bingham Farms, MI (US)

( * ) Notice: Subject to any disclaimer, the term of this patent is extended or adjusted under 35 U.S.C. 154(b) by 3 days.

(21) Appl. No.: 15/260,949

(22) Filed: Sep. 9, 2016

(65) Prior Publication Data

US 2016/0380577 A1 Dec. 29, 2016

Related U.S. Application Data

(63) Continuation of application No. 14/009,697, filed as application No. PCT/US2012/032716 on Apr. 9, 2012, now Pat. No. 9,443,999.

(Continued)

(51) Int. Cl.
*H02S 10/40* (2014.01)
*H02S 20/32* (2014.01)
(Continued)

(52) U.S. Cl.
CPC ............ *H02S 10/40* (2014.12); *F24S 10/746* (2018.05); *F24S 20/20* (2018.05); *F24S 23/70* (2018.05);
(Continued)

(58) Field of Classification Search
CPC ......... H01L 31/02; H01L 31/18; H02S 20/32; H02S 10/40; H02S 30/20; H02S 40/22;
(Continued)

(56) References Cited

U.S. PATENT DOCUMENTS

| 4,371,623 A | 2/1983 | Taylor |
| 4,421,943 A | 12/1983 | Withjack |

(Continued)

FOREIGN PATENT DOCUMENTS

| DE | 4003513 A1 | 8/1991 |
| WO | 2010039999 A2 | 4/2010 |
| WO | 2010129420 A1 | 11/2010 |

OTHER PUBLICATIONS

International Search Report and Written Opinion of the International Searching Authority, International application No. PCT/US2012/032716, dated Jul. 25, 2013, 3 pages.

(Continued)

*Primary Examiner* — Susan D Leong
(74) *Attorney, Agent, or Firm* — Brooks Kushman P.C.

(57) ABSTRACT

A solar collector may include a frame for supporting a plurality of photovoltaic (PV) panels. The frame may be adapted to removably attach to a base. The solar collector may include a first panel assembly, including at least one of the plurality of PV panels, pivotally attached to the frame about a first axis. The solar collector may also include a second panel assembly, including at least one of the plurality of PV panels, pivotally attached to the first panel assembly. The second panel assembly may collectively move with the first panel assembly about the first axis and to pivot relative to the frame, and to pivot about a second axis that is substantially parallel to and radially offset from the first axis, to move between a deployed position and a retracted position.

16 Claims, 10 Drawing Sheets

Related U.S. Application Data

(60) Provisional application No. 61/472,837, filed on Apr. 7, 2011.

(51) Int. Cl.

| | | |
|---|---|---|
| *H02S 30/20* | (2014.01) | |
| *F24S 50/20* | (2018.01) | |
| *F24S 25/20* | (2018.01) | |
| *H01L 31/052* | (2014.01) | |
| *F24S 20/20* | (2018.01) | |
| *F24S 23/70* | (2018.01) | |
| *F24S 10/70* | (2018.01) | |
| *F24S 40/80* | (2018.01) | |
| *F24S 30/452* | (2018.01) | |
| *H01L 31/18* | (2006.01) | |
| *H02S 40/44* | (2014.01) | |
| *H02S 40/22* | (2014.01) | |
| *F24S 25/00* | (2018.01) | |
| *F24S 30/00* | (2018.01) | |

(52) U.S. Cl.
CPC ............. *F24S 25/20* (2018.05); *F24S 30/452* (2018.05); *F24S 40/85* (2018.05); *F24S 50/20* (2018.05); *H01L 31/052* (2013.01); *H01L 31/18* (2013.01); *H02S 20/32* (2014.12); *H02S 30/20* (2014.12); *H02S 40/22* (2014.12); *H02S 40/44* (2014.12); *F24S 2023/872* (2018.05); *F24S 2025/012* (2018.05); *F24S 2030/134* (2018.05); *F24S 2030/145* (2018.05); *F24S 2030/16* (2018.05); *Y02E 10/41* (2013.01); *Y02E 10/44* (2013.01); *Y02E 10/47* (2013.01); *Y02E 10/52* (2013.01); *Y02E 10/60* (2013.01); *Y10T 29/49355* (2015.01)

(58) Field of Classification Search
CPC ... H02S 40/44; F24J 2/38; F24J 2/5211; F24J 2/542
See application file for complete search history.

(56) References Cited

U.S. PATENT DOCUMENTS

| | | | |
|---|---|---|---|
| 4,620,771 A | 11/1986 | Dominguez | |
| 5,542,203 A | 8/1996 | Luoma et al. | |
| 5,696,501 A | 12/1997 | Ouellette et al. | |
| 6,396,239 B1 | 5/2002 | Benn et al. | |
| 6,637,702 B1* | 10/2003 | McCandless | B64G 1/222 244/172.6 |
| 7,487,771 B1 | 2/2009 | Eiffert et al. | |
| 7,898,212 B2 | 3/2011 | Benn et al. | |
| 8,119,963 B2* | 2/2012 | Scanlon | F24J 2/38 136/244 |
| 8,661,747 B2 | 3/2014 | Eide | |
| 2007/0209529 A1 | 9/2007 | Poss et al. | |
| 2009/0223510 A1* | 9/2009 | Larsen | F22B 1/006 126/694 |
| 2010/0000519 A1* | 1/2010 | Zalusky | F24J 2/38 126/601 |
| 2010/0060229 A1 | 3/2010 | Benn et al. | |
| 2010/0212659 A1* | 8/2010 | Carpoff | F24J 2/5233 126/627 |
| 2011/0011657 A1 | 1/2011 | Donnell et al. | |
| 2011/0179791 A1 | 7/2011 | Butler et al. | |
| 2011/0253614 A1 | 10/2011 | Curran et al. | |

OTHER PUBLICATIONS

Restriction Requirement issued in corresponding U.S. Appl. No. 15/759,415, dated Oct. 18, 2018, 8 pages.

* cited by examiner

SOLAR ENERGY COLLECTOR

CROSS-REFERENCE TO RELATED APPLICATIONS

This application is a continuation of U.S. application Ser. No. 14/009,697 filed Oct. 3, 2013 which is the U.S. National Phase of PCT Appln. No. PCT/US2012/032716 filed on Apr. 9, 2012, which claims the benefit of U.S. provisional Application No. 61/472,837 filed Apr. 7, 2011, the disclosures of which are incorporated in their entirety by reference herein.

TECHNICAL FIELD

One or more embodiments relate to solar energy collection, and more particularly to a mobile and collapsible solar collector.

BACKGROUND

Solar collectors are generally provided for collecting energy from the sun. One type of solar collector includes a reflective surface and a collector assembly coupled together for receiving solar energy and using the energy for heating a fluid. The reflective surface focuses sunlight at a focal point. A receiver may be positioned at the focal point, circulating fluid through the receiver to absorb heat. Solar energy is harvested from the heated fluid after circulation. The heat energy may be converted into other forms of energy, such as electricity. Alternatively some solar collectors position a heat engine adjacent to the receiver for harvesting solar energy.

Another type of solar collector includes a photo-voltaic (PV) type. PV panels, comprised of layers of semi-conductor material, receive photons from sunlight and develop a voltage differential between the layers. When a PV panel is connected to an electrical load during this condition, an electrical current is produced because of the voltage differential. Panels may be used in quantities to harness the total energy of multiple panels.

Installing permanent PV panels often faces infrastructure and space constraints. Also, static systems may not be optimal for transient external conditions. It is desirable to have a solar collection unit that is flexible and configurable for various environmental conditions.

SUMMARY

In at least one embodiment, a solar collector is provided with a frame that is coupled to a base and configured to rotate about a vertical axis. A main panel assembly is attached to the frame and pivotal about a first horizontal axis relative to the frame. The main panel assembly is capable of receiving sunlight and converting the sunlight into electrical energy. The main panel assembly includes a central panel, and a pair of inner side panels, where each inner side panel is attached to opposing lateral edges of the central panel. The main panel assembly also has at least a pair of outer side panels. Each outer side panel includes at least one photo-voltaic (PV) panel, a panel frame, and brackets configured to selectively retain the PV panels within the frames. The panel frames are attached to an outermost lateral edge of the corresponding inner side panel. Each panel frame has a horizontal channel member and a pair of upright channel members extending from opposing ends of the horizontal channel member. The horizontal channel member and the upright channel members have an inward facing channel formed therein for receiving a peripheral edge of each PV panel.

In another embodiment, a solar collector is provided with a base and a plurality of wheels coupled to the base for enabling transport. A frame is coupled to the base and configured to rotate about a vertical axis. A main panel assembly attached to the frame and pivotal about a first horizontal axis relative to the frame. The main panel assembly is configured to receive sunlight and convert the sunlight into electrical energy. The main panel assembly includes a central panel, a first inner side panel and a second inner side panel. Each inner side panel is pivotally attached to opposing lateral edges of the central panel and configured to fold over the central panel. The main panel assembly also includes a first outer side panel and second outer side panel. Each outer side panel is attached to an outermost lateral edge of the corresponding inner side panel. Each outer side panel includes at least one photo-voltaic (PV) panel. A secondary PV panel assembly is mounted to the frame and pivotal about a second horizontal axis.

In yet another embodiment, a method is provided for assembling a solar collector. A main panel assembly is provided with at least one surround frame having inward facing mounting channels formed therein, and an open distal end. A first PV panel is inserted through the open distal end and into the mounting channels of the surround frame. The first PV panel is slid along the mounting channels towards a proximal end of the surround frame. A first spacer assembly is inserted through the open distal end and into the mounting channels of the surround frame. The first spacer assembly is slid along the mounting channels to abut against the first PV panel. A second PV panel is inserted through the open distal end and into the mounting channels of the surround frame. The second PV panel is slid along the mounting channels to abut against the first spacer assembly. A bracket member is attached to the open distal end of the surround frame so as to retain a plurality of PV panels and spacer assemblies within the mounting channels of the surround frame.

In another embodiment, a solar collector may include a frame for supporting a plurality of photovoltaic (PV) panels. The frame may be adapted to removably attach to a base. The solar collector may include a first panel assembly, including at least one of the plurality of PV panels, pivotally attached to the frame about a first axis. The solar collector may also include a second panel assembly, including at least one of the plurality of PV panels, pivotally attached to the first panel assembly. The second panel assembly may collectively move with the first panel assembly about the first axis and to pivot relative to the frame, and to pivot about a second axis that is substantially parallel to and radially offset from the first axis, to move between a deployed position and a retracted position.

In another embodiment, a solar collector may include a frame for supporting a plurality of photovoltaic (PV) panels. The solar collector may include a first panel assembly, including at least one of the plurality of PV panels, pivotally attached to the frame about a first axis. The solar panel may include a second panel assembly, including at least one of the plurality of PV panels, pivotally attached to the frame about a second axis that may be substantially parallel to the first axis. The solar panel may include a plurality of support members extending from the frame adapted to receive fasteners for removably attaching the frame to a trailer.

In another embodiment, a solar collector may include a frame for supporting a plurality of photovoltaic (PV) panels.

The solar collector may include a primary panel assembly, including at least one of the plurality of PV panels, pivotally attached to the frame about a first axis. The solar collector may include a secondary panel assembly, including at least one of the plurality of PV panels, pivotally attached to the frame about a second axis that is substantially parallel to the first axis. The primary panel assembly may have a primary central panel and a first primary inner side panel pivotally attached to a lateral edge of the primary central panel. The secondary panel assembly may have a secondary central panel and a first secondary inner side panel pivotally attached to a lateral edge of the secondary central panel. The primary panel assembly and secondary panel assembly may be adapted to individually fold into a closed position.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
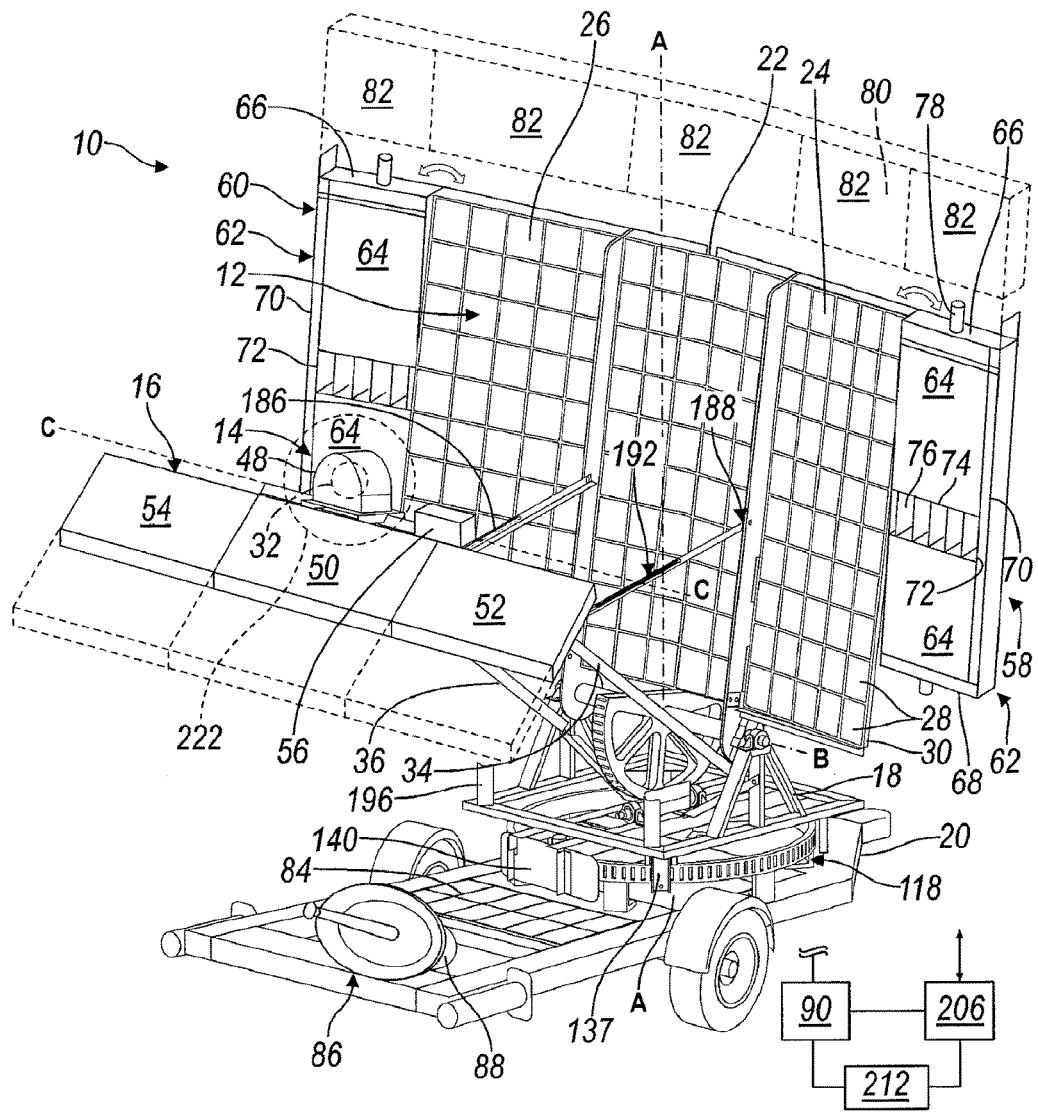
FIG. 1 is a front perspective view of a solar collector according to embodiments of the present invention, illustrated in an extended position with an expanded reflective panel assembly.

With reference to FIG. 1, a solar collector is illustrated in accordance with an embodiment and is referenced generally by numeral 10. The solar collector 10 includes a reflective main panel assembly 12 and a collector assembly 14 coupled together for receiving solar energy and using the energy for heating a fluid. The solar collector 10 also includes a photo-voltaic ("PV") secondary panel assembly 16 for receiving solar energy and converting the energy to electrical energy. The reflective main panel assembly 12, the collector assembly 14 and the PV secondary panel assembly 16 are all connected to a frame 18 for support. The frame 18 is attached to a trailer 20 for transporting the solar collector 10. In other embodiments the frame 18 is configured for mounting to the ground, or configured to be removed from the trailer 20 and mounted to the ground.

The reflective main panel assembly 12 focuses sunlight on the collector assembly 14. The illustrated embodiment depicts a reflective panel assembly 12 with three panels: a central panel 22, a first inner side panel 24, and a second inner side panel 26. In one embodiment of the solar collector 10, each panel 22, 24, 26 is generally the same size, for example ten feet wide and fifteen feet in length. The two inner side panels 24 and 26 are angled inward toward the collector assembly 14. Each panel 22, 24 and 26, contains an array of reflective facets 28 that are organized in a tessellated pattern and embedded in a structure 30. An embodiment of the panel assembly 12 includes the structure 30 being made of aluminum. A robot may be employed to attach and align each facet 28 in the structure 30 of the panels 22, 24, 26. The robot is programmed to orient each facet 28, to reflect sunlight at a common focal point.

In another embodiment of the solar collector 10, each panel of the reflective panel assembly 12 is molded as a single unit to incorporate the contour of each facet (not shown). In one configuration, a fiberglass pattern of a mirror image of each panel can be created using a robot. This pattern may then be used to create a mold of each panel. The panel is then coated with a thin reflective film. Alternatively, the panel may be vacuum-formed and similarly coated with a reflective film. This process will improve the reflective efficiency of the panel assembly from approximately ninety-two percent for individual facets to ninety-five to ninety-six percent for a single piece thin film panel.

The collector assembly 14 includes a receiver 32 that is supported by an inlet tube 34 and an outlet tube 36. Light is reflected by the panel assembly 12 to a common focal point. The receiver 32 is positioned at the focal point. The tubes 34 and 36 also provide a path for fluid to travel between the trailer 20 and the receiver 32.

Figure 2:
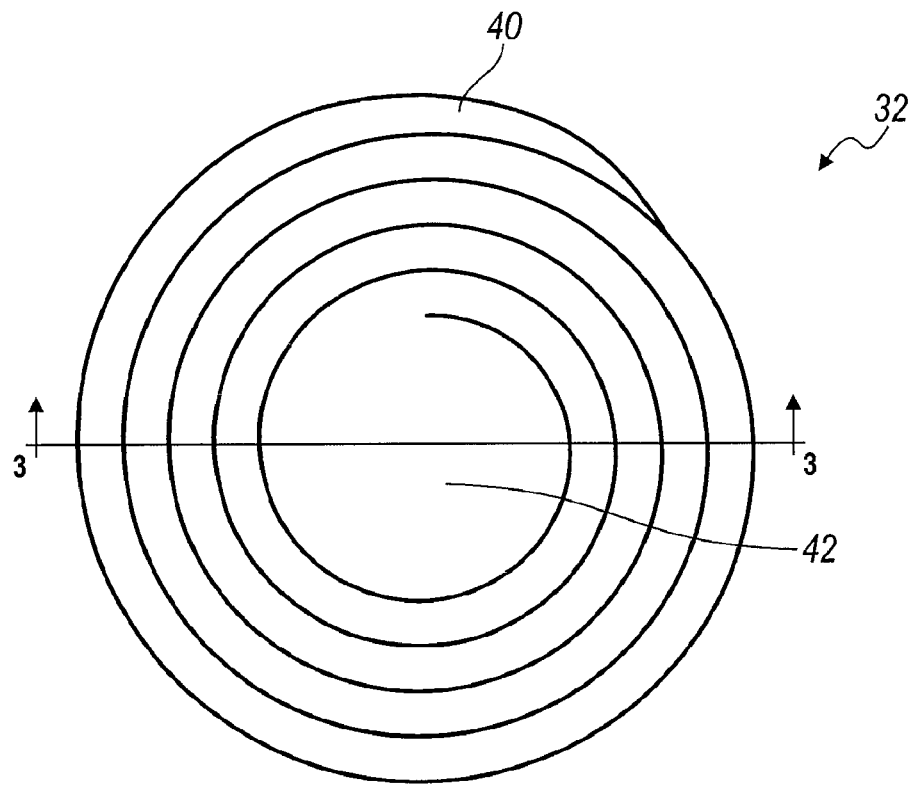
FIG. 2 is a front view of a receiver of the solar collector of FIG. 1.
Figure 3:
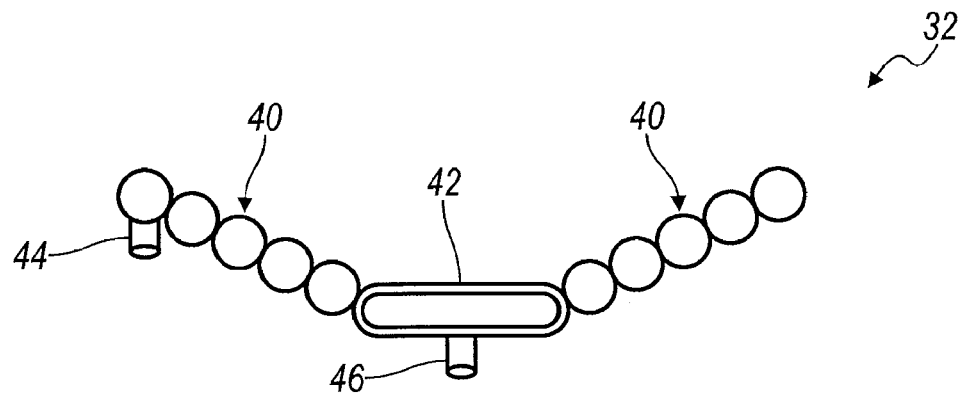
FIG. 3 is a section view of the receiver of FIG. 2, taken along section line 3-3.

Referring to FIGS. 1-3, fluid circulates through the receiver 32 while the fluid is heated by the focused sunlight. The receiver 32 has a generally frusto-conical shape formed by a coiled tube 40 and a central body 42. The coiled tube 40 includes an inlet port 44 for receiving fluid from the inlet tube 34. Fluid travels from the inlet port 44 through the coiled tube 40 and to the central body 42. The heated fluid exits the receiver 32 at an outlet port 46 and travels back toward the trailer 20 through the outlet tube 36.

The receiver 32 is enclosed by a shell 48 to retain heat. The shell 48 may provide a shroud for preventing the bright focused sunlight from harming the eyes of a bystander. Looking into a bright concentrated light source or image (e.g., the sun or an arc during welding) may harm a bystander's eyes. The sunlight that is reflected by the panel assembly 12 at the receiver 32 may create such a bright focused light. By extending the shell 48 towards the panel assembly 12, the area is limited from which a bystander may view the bright light that is focused on the receiver 32. Additionally, the shell 48 contemplates the addition of a funnel or "flux-stuffer" (not shown) positioned within the shell for further focusing the reflected sunlight upon the receiver 32.

A fluid supply and pump (not shown) are connected to the solar collector 10 at the inlet tube 34. The pump circulates the fluid through the collector assembly 14. Additionally, the outlet tube 36 is connected to a heat exchanger (not shown) for converting the heated fluid into other forms of energy.

With reference to FIG. 1, the PV secondary panel assembly 16 converts solar energy into electrical energy. According to one embodiment, the PV panel assembly 16 includes a central PV panel 50, a first outer PV panel 52, and a second outer PV panel 54. A distal end of the inlet tube 34 and the outlet tube 36 are coaxially aligned to define a horizontal axis C-C. The PV panel assembly 16 is pivotally connected to the tubes 34, 36 for pivoting about axis C-C. Although the illustrated embodiment depicts three PV panels 50, 52, 54, the solar collector 10 contemplates other combinations and sizes of panels as indicated by the additional panels shown in phantom in FIG. 1. In one embodiment, each panel is generally the same size (e.g., thirty-nine inches by fifty-nine inches) and generates between one hundred ninety and two hundred sixty Watts.

The PV secondary panel assembly 16 is independently adjustable, according to one embodiment. The PV panel assembly 16 is more efficient, and generates more electrical energy when the panels 50, 52, 54 are aligned with the sun. A PV secondary panel pitch actuator 56 is mounted to the tubes 34, 36 and coupled to the PV panel assembly 16, for pivotally adjusting the assembly 16 about the horizontal axis C-C to track the sun. Alternatively, in one embodiment the PV secondary panel assembly 16 is rigidly attached to the tubes 34, 36 for pivoting with the reflective panel assembly 12.

In at least one embodiment, the solar collector 10 includes additional PV panel assemblies that are attached about the outer perimeter of the reflective panel assembly 12. A first outer side panel assembly 58 may be attached to the first inner side panel 24, and a second outer side panel assembly 60 attached to the second inner side panel 26. Each outer side panel assembly 58, 60 includes a frame 62 for supporting a pair of individual PV panels 64. The frame 62 is formed by an upper bracket 66 and a lower bracket 68 that each extend outward from the inner side reflective panels 24, 26. The frame 62 also includes an upright bracket 70 that connects the upper bracket 66 to the lower bracket 68.

The efficiency of PV panels, such as panels 64, depends on temperature. At high temperature, the panels 64 become less efficient and generate less electrical energy. In one embodiment, a spacer assembly 72 is oriented between adjacent panels 64. The spacer assembly 72 includes a rectangular housing 74 with a plurality of fins 76 that are spaced apart along a lateral length of the housing 74. The fins 76 dissipate heat away from each panel 64 by conduction. Additionally, air circulates through each spacer assembly 72 to allow heat to dissipate by convection, which provides a passive cooling system In one embodiment, the outer side panel assemblies 58, 60 are assembled after the solar collector 10 is transported to a desired location. The frame 62 is formed from channeled tubing. The upper bracket 66 of the frame 62 is pivotally connected to the outer portion of the reflective panel assembly 12, and may pivot away from the upright bracket 70, as indicated by the curved arrows in FIG. 1. Once the upper bracket 66 is pivoted away from the upright bracket 70, the panels 64 and the spacer assembly 72 are installed (or removed) from the outer side panel assembly 58, 60. Each outer side panel assembly 58, 60 may include a fastener 78 that engages a threaded aperture (not shown) formed in the upper bracket 66. The fastener 78 may be adjusted to apply a compressive load on the panels 64 of each panel assembly 58, 60 to maintain a longitudinal position within the frame 62. Alternatively, a plurality of fasteners (not shown) may be provided for affixing the panels 64 to the frame 62 about an outer periphery. In one embodiment, both the upper and lower brackets 66, 68 are pivotally connected to the frame 62 to allow the reflective panel assembly 12 to fold into a compact closed position.

In another embodiment of the solar collector 10, an upper PV panel assembly 80 is attached to reflective panel assembly 12. The upper PV panel assembly 80 is attached to an upper peripheral edge of the reflective panel assembly 12, and includes five individual panels 82, as illustrated in phantom in FIG. 1. Additionally, a lower PV panel 84 may be mounted to the trailer 20. As illustrated in FIG. 1, the solar collector 10 contemplates a variety of different configurations of PV panels. Other embodiments of the solar collector 10, contemplate concentrated photo-voltaic panels ("CPV) and combinations of PV and CPV panels.

In one embodiment of the solar collector 10, an adjustable satellite dish 86 is mounted to the trailer 20. The dish 86 is configured for communicating with a satellite (not shown). The satellite dish 86 may further be used to receive remote operation commands, or receive broadcast information such as weather conditions and forecasts. The dish 86 includes adjustment actuators 88 for adjusting the position (rotation and yaw) of the dish to relative to the satellite.

The solar collector 10 includes a battery 90 for storing electrical energy. The battery 90 is electrically connected to each PV panel and actuator of the solar collector 10.

Figure 4:
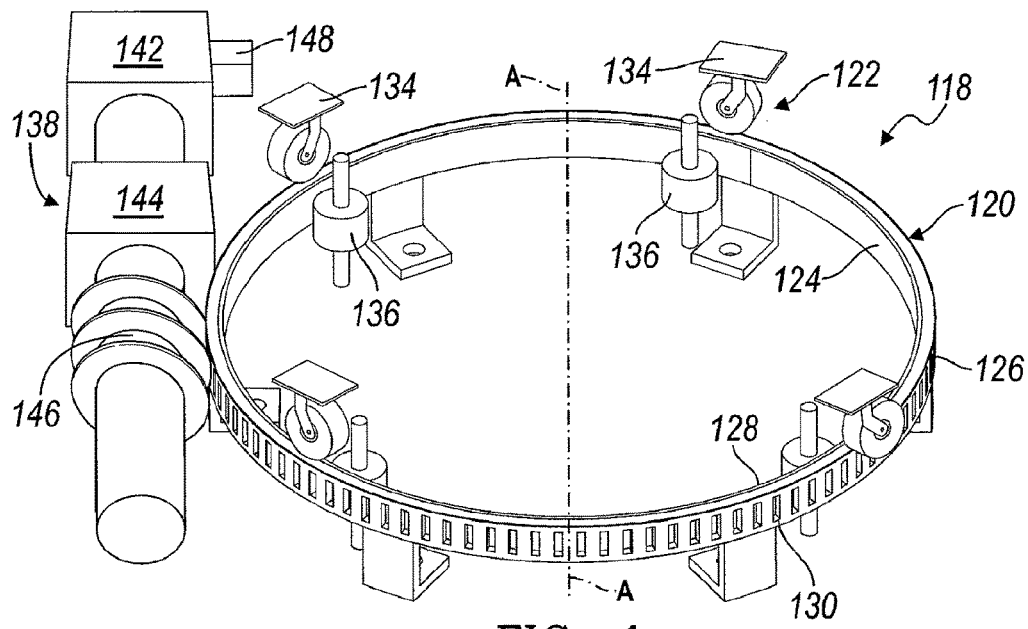
FIG. 4 is a front perspective view of a rotation gear assembly of the solar collector of FIG. 1.

Referring to FIGS. 1 and 4, a rotation gear assembly 118 is provided for adjusting a rotational position of the panel assemblies 12, 16 and collector assembly 14 about a vertical axis A-A. The rotation gear assembly 118 includes a gear wheel 120 and a bearing assembly 122 operatively coupled to one another.

The gear wheel 120 is mounted upon the trailer 20 in a generally horizontal orientation. The gear wheel 120 includes a channeled tube 124, a slotted plate 126 and a rod 128 that are coupled to each other and formed into a ring. The channeled tube 124 is formed of an elongate partially enclosed tube. In one embodiment of the solar collector 10, the channeled tubing is formed of "C-Channel" tubing. The slotted plate 126 is formed of an elongate sheet of material. A series of slots 130 project through plate 126. The series of slots 130 are longitudinally spaced along a length of the plate 126. The slotted plate 126 is disposed over channeled tube 124, thereby forming an enclosed cavity within the tube 124. The slotted plate 126 is oriented about a circumference of the ring with the slots 130 facing outward. The slots 130 in the depicted embodiment act as gear teeth. The rod 128 is disposed upon an upper portion of the channeled tube 124 about a perimeter of the ring for engaging the bearing assembly 122. Other embodiments of the solar collector 10 envision a unitary gear wheel, (e.g., a die cast or molded gear wheel).

The bearing assembly 122 provides a low friction interface during rotational adjustment. The reflective panel assembly 12 and collector assembly 14 are coupled to a frame 18. The bearing assembly 122 couples the frame 18 to the gear wheel 120. The bearing assembly 122 includes a series of casters 134 and a series of roller bearings 136 cooperating with each other. The casters 134 are mounted to an under surface of the frame 18 and support the frame 18 as it rides along the perimeter of the gear wheel 120. In one embodiment of the solar collector 10, the casters 134 engage the rod 128. The roller bearings 136 are mounted to the frame 18 and are configured for engaging an inner diameter of the gear wheel 120. A bracket 137 which extends from the frame 18, wraps around the outer diameter of the gear wheel 120, thereby helping to secure the frame 18 to the gear wheel 120 during high eccentric loading. The roller bearings 136 also help maintain a radial alignment of the frame 18 relative to the gear wheel 120.

A rotation actuator 138 engages the rotation gear assembly 118 for adjusting the rotational position of the reflective panel assembly 12 and collector assembly 14. The rotation actuator 138 is mounted tangentially to the gear wheel 120, upon a plate 140 which extends downward from the frame 18. The rotation actuator 138 includes a rotation motor 142, a rotation reduction gear train 144 and a rotation worm 146 operatively coupled to one another. The rotation motor 142 may be an AC or DC motor, configured for receiving electrical power from a battery or AC power source (not shown) and converting it into mechanical rotational power. The reduction gear train 144 is coupled to the output of the motor 142. The reduction gear train 144 is sized for increasing the output torque of the motor 142. The rotation worm 146 is coupled to the output of the reduction gear train 144. The worm 146 is configured for meshing with the slotted plate 126 of the gear wheel 120. The worm 146 is also configured to be self-locking, such that torque applied to the worm 146 cannot back-drive the rotation motor 142. Additionally, a gear housing (not shown) may be provided for enclosing the worm 146 and preventing particles (e.g., dirt, debris) from collecting in the gear mesh.

The rotation actuator 138 includes a rotational position sensor 148 (e.g., a potentiometer, encoder, hall-effect sensor, etc.) for indicating the position and/or speed of the rotation actuator 138, which corresponds to a position of the reflective panel assembly 12. In one embodiment of the solar collector 10, an encoder is coupled to the motor 142 for measuring output angular travel. Alternate embodiments of the solar collector 10 envision a sensor coupled to the frame for indicating the angular position of the frame.

Figure 5:
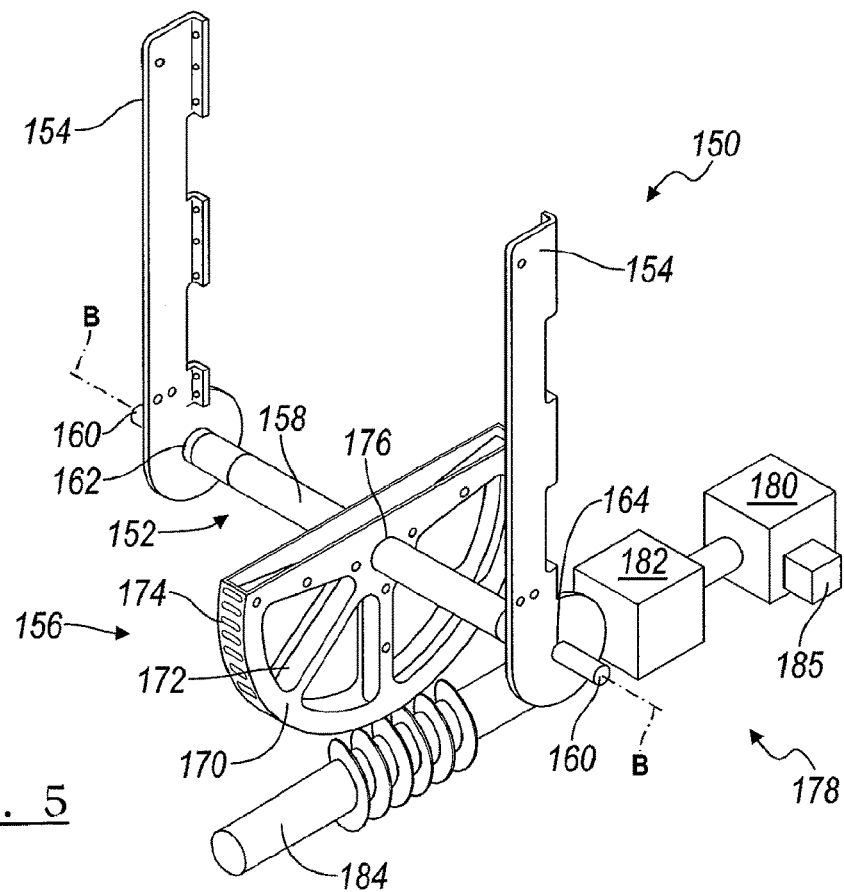
FIG. 5 is a front perspective view of a pitch gear assembly of the solar collector of FIG. 1.

Referring to FIGS. 1 and 5, a pitch gear assembly 150 is provided for adjusting an elevation or pitch of the reflective panel assembly 12 and the collector assembly 14 about a horizontal axis B-B. The pitch gear assembly 150 includes a transverse axle 152 a pair of panel brackets 154 and a sector 156 coupled to each other. In one embodiment, that the collector assembly 14 pivots about a second horizontal axis (not shown) that is parallel to the horizontal axis B-B.

The transverse axle 152 provides the horizontal axis B-B for the reflective panel assembly 12 and collector assembly 14 to pivot about. The transverse axle 152 includes a tube 158 and a pair of axlerods 160 coupled to one another. The axlerods 160 and the tube 158 are aligned coaxially, such that the axlerods 160 extend from opposing ends of the tube 158. The axlerods 160 have an outer diameter that is smaller than the outer diameter of the tube 158, thereby forming a shoulder 162.

The panel brackets 154 extend from the transverse axle 152 for supporting the reflective panel assembly 12. Each panel bracket 154 includes a rod aperture 164, for receiving an axlerod 160. The rod apertures 164 are sized smaller than the outer diameter of the tube 158, such that each panel bracket 154 abuts a corresponding shoulder 162. The panel brackets 154 are aligned with each other and fixed to the transverse axle 152. The brackets 154 are coupled to opposing lateral edges of the central panel 22 and inner edges of both of the outer panels 24, 26 for supporting the reflective panel assembly 12.

The sector 156 receives mechanical power for adjusting the pitch of the reflective panel assembly 12 and the collector assembly 14. The sector 156 includes a pair of partially circular gear plates 170, a series of ribs 172 and a slotted plate 174 coupled to each other. Each gear plate 170 includes a central aperture 176 sized for receiving the transverse axle 152. The series of ribs 172 are positioned between the gear plates 170, for connecting the plates 170 to each other. The ribs 172 radially extend from the central apertures 176. The slotted plate 174 is disposed over a curved portion of a perimeter of the gear plates 170, thereby further connecting the gear plates 170 to each other. The slotted plate 174 of the depicted embodiment acts as gear teeth. The sector 156 is axially aligned about a mid-portion of a length of the transverse axle 152. The sector 156 is rotationally oriented about the transverse axle 152 such that a flat non geared/slotted portion of the sector 156 is perpendicular to a length of the brackets 154. In one embodiment, the sector 156 is welded to the transverse axle 152 about the central aperture 176. In another embodiment, a plate (not shown) is fastened to the sector 156. The plate includes an aperture for receiving the transverse axle 152, and allows for removal of the sector 156 for maintenance.

A pitch actuator 178 engages the pitch gear assembly 150 for adjusting the elevation or pitch of the reflective panel assembly 12 and collector assembly 14. The pitch actuator 178 rotates the reflective panel assembly 12 about the transverse axle 152. The pitch actuator 178 is mounted tangentially to the sector 156 at a central portion of the frame 18. The pitch actuator 178 includes a pitch motor 180, a pitch reduction gear train 182 and a pitch worm 184 operatively coupled to one another. The pitch motor 180 may be an AC or DC motor, configured for receiving electrical power from a battery or AC power source (not shown) and converting it into mechanical rotational power. The reduction gear train 182 is coupled to the output of the motor 180. The reduction gear train 182 is sized for increasing the output torque of the motor 180. The pitch worm 184 is coupled to the output of the reduction gear train 182. The worm 184 is configured for meshing with the slotted plate 174 of the sector 156. The worm 184 is also configured to be self-locking, such that torque applied to the worm 184 cannot back-drive the pitch motor 180. Additionally, a gear housing (not shown) may be provided for enclosing the worm 184 and preventing particles (e.g., dirt, debris) from collecting in the gear mesh.

The pitch actuator 178 includes a pitch sensor 185 (e.g., a potentiometer, encoder, hall-effect sensor, etc.) for indicating the position and/or speed of the pitch actuator 178, which corresponds to a position (altitude angle) of the reflective panel assembly 12. In one embodiment of the solar collector 10, an encoder is coupled to the motor 180 for measuring output angular travel.

A pair of struts 186 is provided for coupling both the collector assembly 14 and the PV secondary panel assembly 16 to the reflective panel assembly 12. A proximal end 188 of each strut 186 is pivotally connected to an upper portion of a corresponding panel bracket 154. Intermediate portions of each strut 186 are slidably attached to tubes 34, 36.

Figure 6:
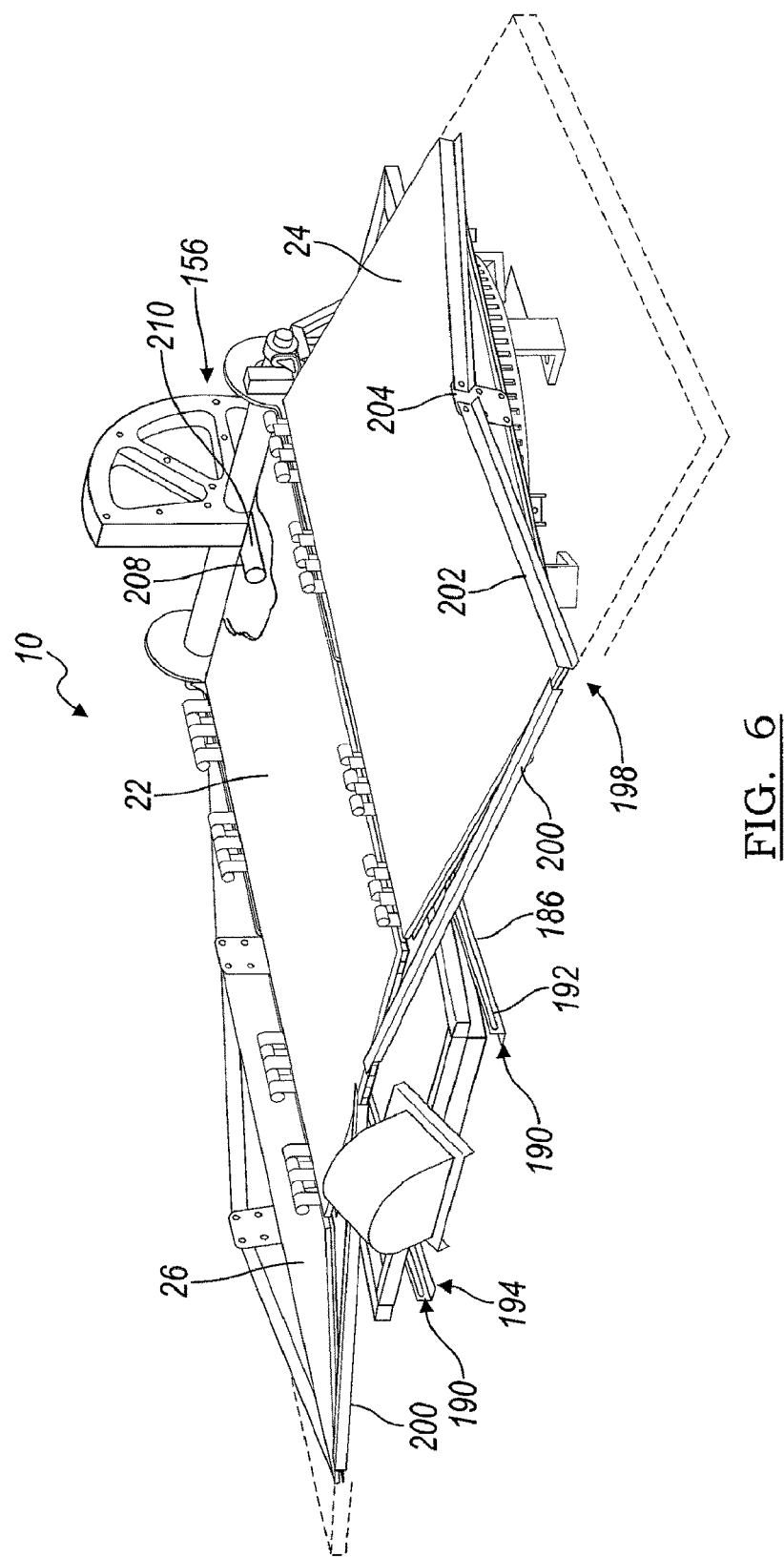
FIG. 6 is another front perspective view of the solar collector of FIG. 1, illustrated in a stowed position.

Referring to FIGS. 1 and 6, the pair of struts 186 provides a translational connection between the reflective panel assembly 12 and the collector assembly 14. A pair of collector pins (not shown) extends inwardly from the intermediate portion of the collector assembly 14. A strut slot 192 is formed along the length of each strut 186. Each strut slot 192 is configured for receiving one of the collector pins. An end stop 194 formed in the distal end 190 of each slot 192 provides a reaction force against the collector pin for supporting the collector assembly 14. A pair of collector rests 196 contacts the collector assembly 14 when the solar collector 10 is adjusted towards the stowed position depicted in FIG. 6. The collector assembly 14 stops pivoting once it contacts the rests 196, however the reflective panel assembly 12 continues to pivot. The strut slots 192 translate and pivot relative to the collector pins as the reflective panel assembly 12 continues to adjust and collapses upon the collector assembly 14.

FIG. 6 illustrates the solar collector 10 with a panel support assembly 198 for supporting and maintaining the reflective panel assembly 12 in an expanded and stowed position. The support assembly 198 includes lateral supports 200 and longitudinal supports 202 coupled to each other. A pair of lateral supports 200 each extends from the central panel 22 to an inner side panel 24, 26 for maintaining an obtuse angle between the central panel 22 and adjacent inner side panels 24, 26. A pair of longitudinal supports 202 and a support bracket 204 are coupled to each other for supporting each inner side panel 24, 26. The support bracket 204 extends transversely from an outer lateral edge of each inner side panel 24, 26. Each of the pair of longitudinal supports 202 extends from the support bracket 204 to opposite corners of the inner side panel 24, 26, thereby forming a truss for strengthening the reflective panel assembly 12 for withstanding wind loading. The spacer assembly 72 allows air to pass through each outer side panel assembly 58, 60 for reducing wind loading.

The solar collector 10 includes a controller 206. The controller 206 uses an algorithm to determine the position of the sun relative to the current position of the solar collector 10, according to one embodiment. When the controller 206 determines that the solar collector 10 is not properly aligned with the sun, the controller 206 communicates with the pitch actuator 178 the rotation actuator 138, and the PV panel pitch actuator 56, controlling them to adjust each corresponding panel assembly to an alignment with the sun so as to optimize energy collection. The algorithm may use the geographic position of the solar collector 10, along with the present date and time to calculate the position of the sun relative to the solar collector 10. Alternate embodiments envision the controller 206, communicating with sensors of the solar collector to determine the current position, for example pitch sensor 185 indicating the altitude angle and rotational sensor 148 indicating the angular position of the frame.

In another embodiment, the solar collector 10 monitors light intensity to determine the position of the sun relative to the current position of the solar collector 10. A solar tracker 208 is mounted to the sector 156 and oriented adjacent to the central panel 22. The solar tracker 208 includes a post 210 with a plurality of light sensors (not shown) disposed about the post 210. The sensors are electrically connected to the controller 206 and provide signals that are indicative of the light intensity measured by each sensor. As the position of the sun relative to the solar collector 10 changes, a shadow created by the post 210 shades different sensors, and the corresponding signals change. The controller 206 communicates with the rotation actuator 138 and the pitch actuator 178 to adjust the position of the reflective panel assembly 12 in response to the signals provided by the light sensors. In another embodiment of the solar collector 10, the sensors are located within tubes (as described herein with respect to FIGS. 16 and 17) for limiting the amount of light that reaches each sensor thereby increasing sensitivity.

According to one embodiment, the solar collector 10 includes a cell phone diagnostic system 212 in communication with the controller 206. The diagnostic system 212 provides periodic checks of the solar collector 10. Additionally, the diagnostic system 212 allows a user to communicate with the solar collector 10 remotely.

Figure 7:
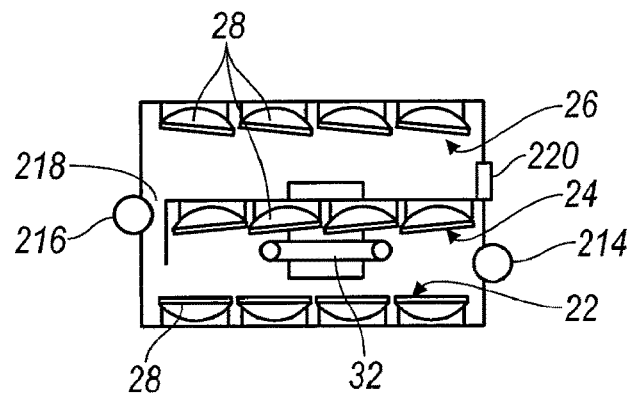
FIG. 7 is a schematic view of the solar collector of FIG. 1, illustrated with a closed reflective panel assembly.
Figure 8:
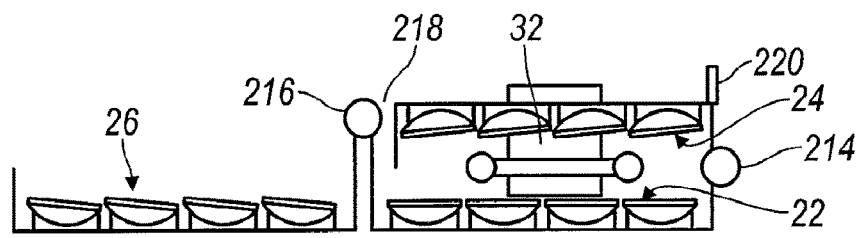
FIG. 8 is another schematic of the solar collector of FIG. 1, illustrated with a partially expanded reflective panel assembly.
Figure 9:
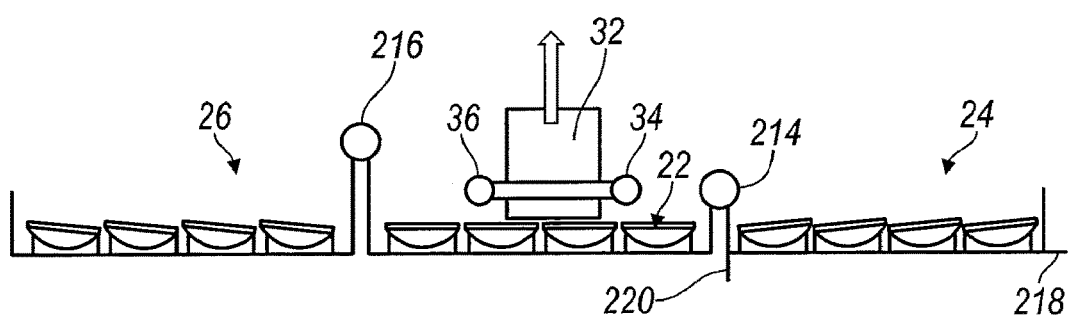
FIG. 9 is yet another schematic of the solar collector of FIG. 1, illustrated with an expanded reflective panel assembly.

With reference to FIGS. 7-9, the panel assembly 12 folds over itself into a closed position for transport. A hinge 214 pivotally connects the first inner side panel 24 to the central panel 22. The first inner side panel 24 folds over the central panel 22, as illustrated in FIG. 8. An extended hinge 216 pivotally connects the second inner side panel 26 to the central panel 22. The extended hinge 216 defines axis that is offset from the central panel 22 such that the second inner side panel 26 folds over both the central panel 22 and the first inner side panel 24, as illustrated in FIG. 7. The first inner side panel 24 includes a support brace 218 that extends outward from the panel 24. The support brace 218 engages the extended hinge 216, when the first inner side panel 24 is folded over the central panel 22 for support. The first inner side panel 24 also includes a support bracket 220 that extends perpendicularly from the panel 24. The support bracket 220 engages the second inner side panel 26 for both supporting the panel 26, and locking the panel 26 to the first inner side panel 24 when the reflective panel assembly 12 is oriented in the closed position. This folding configuration of the reflective panel assembly 12 is illustrated in FIG. 7.

In one embodiment where panel assembly 12 includes reflective panels, the reflective facets 28 of each panel 22, 24, 26 are all oriented inward for protecting the facets 28 from damage during transport. The collector assembly 14 is also partially enclosed by the panel assembly 12 during transport. The length of the tubes 34, 36 is longer than the length of each panel of the panel assembly 12. Therefore the panel assembly 12 folds to enclose the tubes 34, 36; however the receiver 32 is positioned beyond the panels 22, 24, 26.

The solar collector 10 contemplates other folding configurations for the reflective panel assembly 12, such as those described in PCT Application No. PCT/US2009/059283 to Butler et. al, the disclosure of which is incorporated by reference in its entirety herein.

Alternate embodiments of the solar collector 10 envision a system for charging electric vehicles off of the electric power grid. Many electric and hybrid electric vehicles include power cables for "plugging in" the vehicle when it is parked. A solar collector 10 or a series of solar collectors 10 may be positioned at parking lots for businesses (e.g., at the supermarket or at an apartment complex) for allowing a driver to charge their vehicle using energy stored in the solar collector(s), without having to plug into the electrical power grid.

Another embodiment of the solar collector 10, envisions the solar collector 10, coupled to a portable tele-communication tower (not shown) for facilitating communication (e.g., cellular phone communication). The solar collector 10 may provide electrical power to the tower during initial set-up and during operation. Such a solar collector 10 could be utilized in a disaster area (e.g., post hurricane or flood sites).

An embodiment of the solar collector 10, includes individual panel adjustment mechanisms (not shown). The center and two side mirror panels are mounted in such a way that they can be independently aligned with respect to the tracking support and each other to make their reflected images coincident or adjacent to each other in the receiver plane. This is accomplished by providing adjustments at the panel mounting points for the central panel and mechanism to tilt the hinges on the side panels. These adjustments consist of shims or threaded adjustable linkages.

Referring to FIG. 1, additional embodiments of the solar collector 10 envision alternate receiver systems 222 for receiving reflected sunlight from the reflective panel assembly 12. These alternate receiver systems 222 may include a closed-cycle regenerative heat engine, steam turbine and photovoltaic (PV) receiver. Additionally the reflective panel assembly 12 may be configured specifically for each type of system 222.

One embodiment of the solar collector 10, includes a high concentration receiver system 222 having a closed-cycle regenerative heat engine. A Stirling Engine, such as that disclosed in U.S. Pat. No. 6,513,326 to Macenda et al., and assigned to Infinia Inc., which is herein incorporated by reference, may be utilized as the receiver system 222. This engine includes heat exchanging elements made from multiple platelets that are stacked and joined together, which allows for efficient heat transfer.

An embodiment of the reflective panel assembly 12, which is coupled to the Stirling engine receiver system 222, provides a single point aiming strategy to heat the engine to an operating temperature of 800° C. The reflective panel assembly 12 includes 2,400 (3"×3") facets to provide a peak flux of 2,400 Suns. The reflective panel assembly 12 is configured to create a 4"×4" image on the engine, using a Gaussian flux distribution.

Another embodiment of the solar collector 10, includes a medium concentration steam turbine receiver system 222. In addition to the electricity generated from the turbine, the high temperature heat from the turbine exhaust may be used to process food or supply steam for industrial heating or cooling. For example a small Pelton Wheel turbine may be used. The steam turbine may be coupled to a feedwater pump, pressurized water receiver, and a flash boiling steam drum. A vapor-to-liquid steam condenser is provided to allow the waste heat to be sent to the industrial processes, to recycle the condensate, and to improve the performance of the system.

An embodiment of the reflective panel assembly 12, which is coupled to the steam turbine receiver system 222, provides a single point aiming strategy to heat the turbine to an operating temperature of 550° C. The reflective panel assembly 12 includes 1,350 (4"×4") facets to provide a peak flux of 1,350 Suns. The reflective panel assembly 12 is configured to create a 5"×5" image on the turbine, using a Gaussian flux distribution.

Another embodiment of the solar collector 10, includes a PV receiver system 222 which provides a low concentration receiver. One embodiment of a PV receiver includes a reflecting Fresnal small mirror element as a primary optic, and Winston compound parabolic secondary optics. Another PV receiver, such as that disclosed in US. Patent Application Publication No. 2009/0114213 to McDonald et al. and assigned to SolFocus, Inc., which is herein incorporated by reference, may be utilized as the receiver system 222.

An embodiment of the reflective panel assembly 12, which is coupled to the PV receiver system 222, provides a four point aiming strategy. The reflective panel assembly 12 includes 338 (4"×4") facets to provide a peak flux of 337 Suns. The reflective panel assembly 12 is configured to create an 8"×8" image on the receiver, using a flat flux distribution.

Another embodiment of the solar collector 10 includes a satellite receiver system 222, where the satellite dish 86 is mounted to the tubes 34, 36. For such an embodiment, the reflective panels 22, 24, 26 would be replaced by PV panels (not shown).

Figure 10:
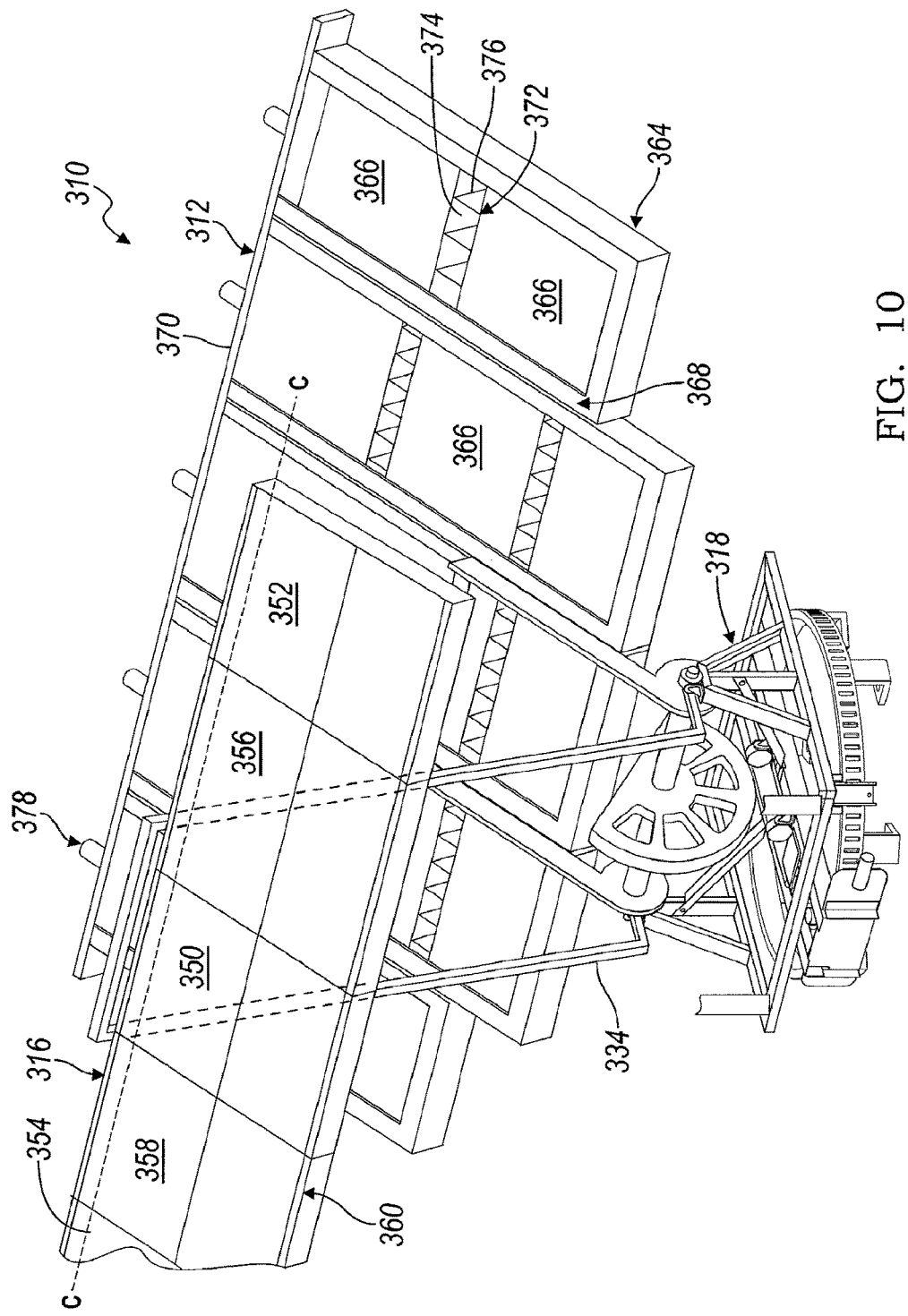
FIG. 10 is a front perspective view of a solar collector according to another embodiment, illustrated in an extended position with an expanded PV panel assembly.

With reference to FIG. 10, a solar collector is illustrated in accordance with another embodiment and is referenced generally by numeral 310. The solar collector 310 includes all PV panels, including an upper PV panel assembly 312 and a lower PV panel assembly 316 for receiving solar energy and converting the energy to electrical energy. The panel assemblies 312, 316 are each connected to a frame 318 for support. The frame 318 may also be attached to a trailer 20 (shown in FIG. 1) for transporting the solar collector 310. Other embodiments of the solar collector 310 include combinations of PV and CPV panels.

The lower PV panel assembly 316 is pivotally connected to supports or elongate members 334 for pivoting about axis C-C. The illustrated embodiment depicts the lower PV panel assembly 316 with ten individual PV panels: a central panel 350, a first outer panel 352, a second outer panel 354, a first inner panel 356, and a second inner panel 358. A lower row of five panels 360 is attached to the corresponding upper panels 350, 352, 354, 356, 358. Other embodiments of the solar collector 310 contemplate different quantities and configurations of lower PV panels.

Figure 11:
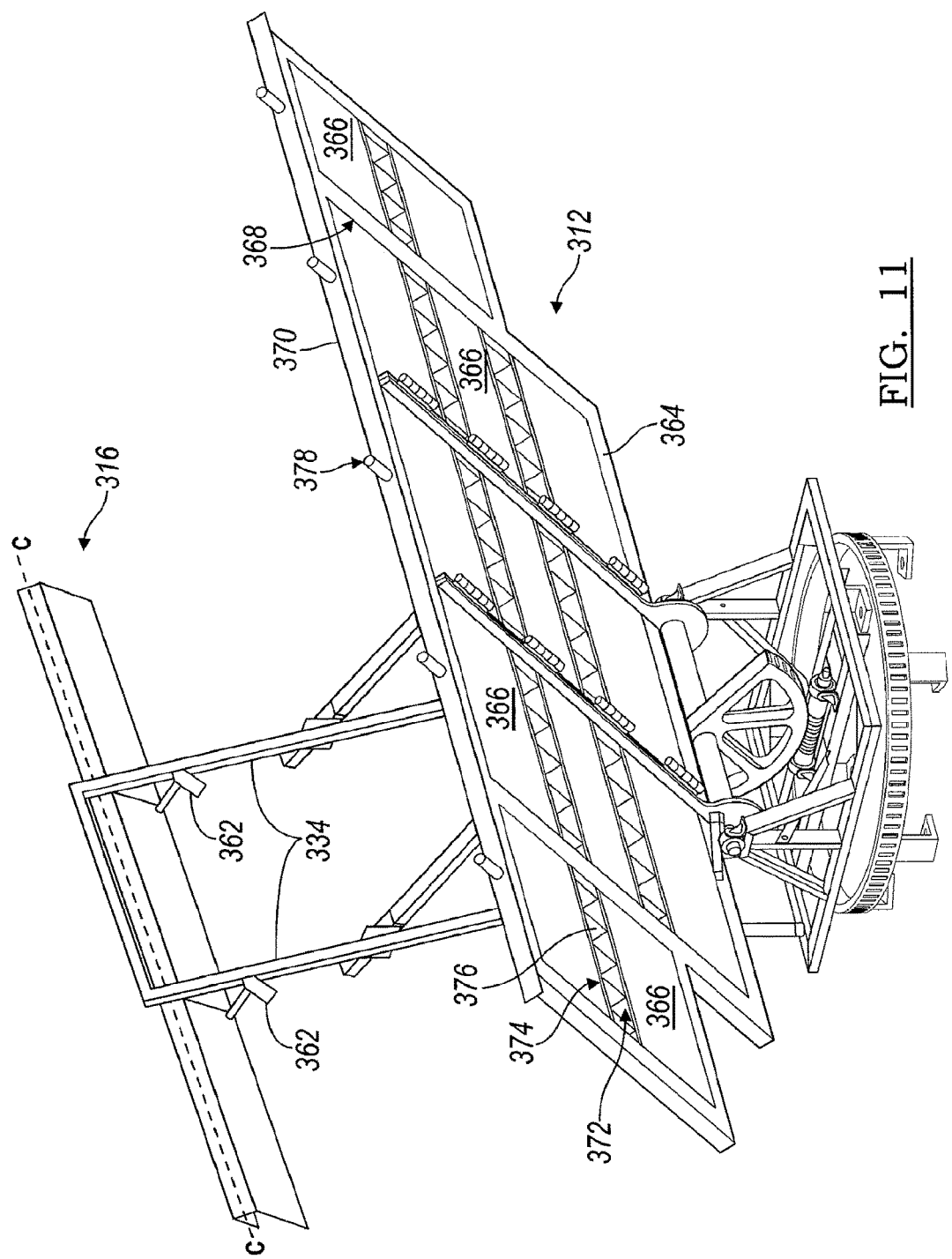
FIG. 11 is a rear perspective view of the solar collector of FIG. 10, illustrated in an extended position with an expanded PV panel assembly.

Referring to FIGS. 10 and 11, the lower PV panel assembly 316 is independently adjustable, according to one embodiment. The lower PV panel assembly 316 is more efficient, and generates more electrical energy when the panels 350, 352, 354, 356, 358, 360 are aligned with the sun. Each of a pair of PV panel pitch actuators 362 is mounted to one of the supports 334 and coupled to the lower PV panel assembly 316, for pivotally adjusting the assembly 316 about the horizontal axis C-C to track the sun. Alternatively, in one embodiment the lower PV panel assembly 316 is rigidly attached to the supports 334 for pivoting with the upper PV panel assembly 312.

Figure 12:
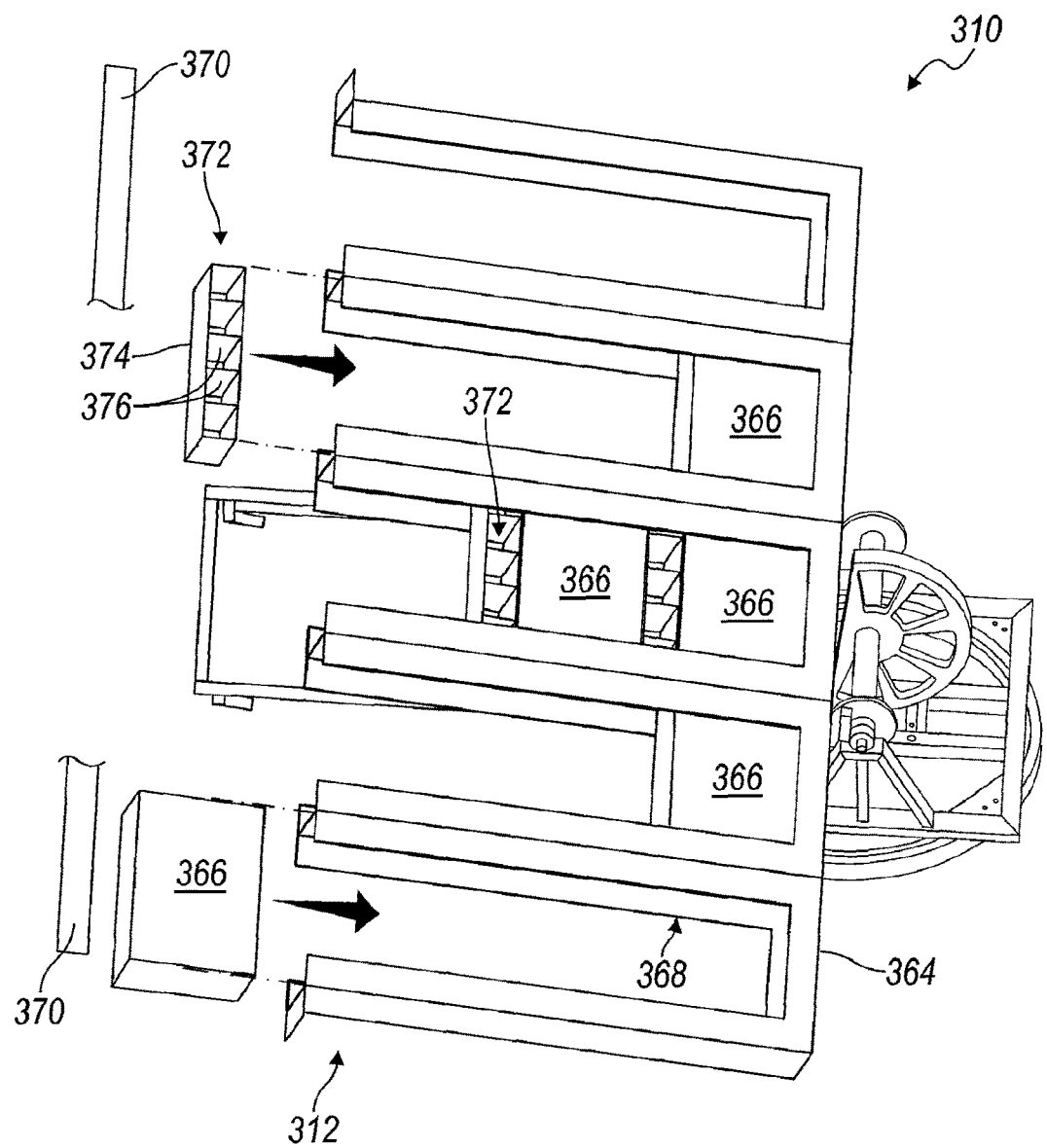
FIG. 12 is a top perspective view of the solar collector of FIG. 10, illustrated in a stowed position with partially assembled PV panels.

In reference to FIGS. 10-12, the upper PV panel assembly 312 includes a frame 364 for supporting a plurality of individual PV panels 366. The frame 364 includes channeled tubing 368 that is configured into five adjacent columns of panels 366. The frame 364 receives the lower and side portions of each panel 366. A top bracket 370 is attached to an upper portion of the frame 364 to enclose the panels 366 within the frame 364. Other embodiments of the solar collector 310 include a separate top bracket 370 for each column of panels 366.

In one embodiment, a spacer assembly 372 is oriented between adjacent panels 366. The spacer assembly 372 includes a rectangular housing 374 with a plurality of fins 376 that are spaced apart along a lateral length of the housing 374. The fins 376 transfer heat away from each panel 366 by conduction. Additionally, air circulates through each spacer assembly 372 to allow heat transfer by convection.

The upper PV panel assembly 312 includes a fastener 378 that engages a threaded aperture (not shown) formed in the top bracket 370. The fastener 378 may be adjusted to apply a compressive load on the panels 366 to maintain a longitudinal position within the frame 364. Alternatively, a plurality of fasteners (not shown) may be provided for attaching the panels 366 to the frame 364 about an outer periphery.

FIG. 12 depicts the solar collector 310 in a stowed position. Once the top bracket 370 is removed as shown, the panels 366 and the spacer assemblies 372 are installed (or removed) from the upper PV panel assembly 312.

Figure 13:
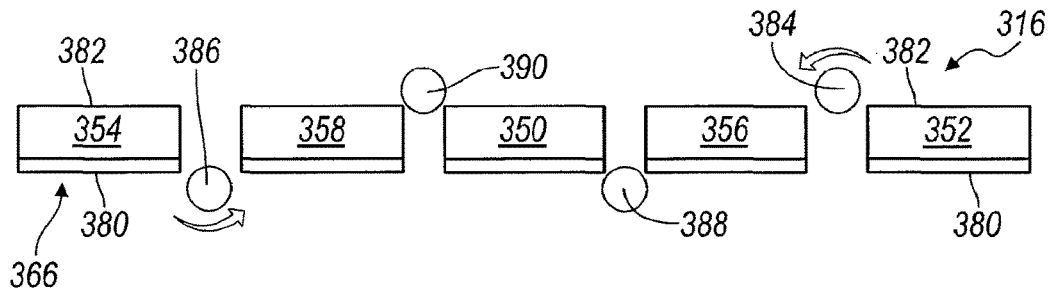
FIG. 13 is a schematic view of the solar collector of FIG. 10, illustrated with an expanded PV panel assembly.
Figure 14:
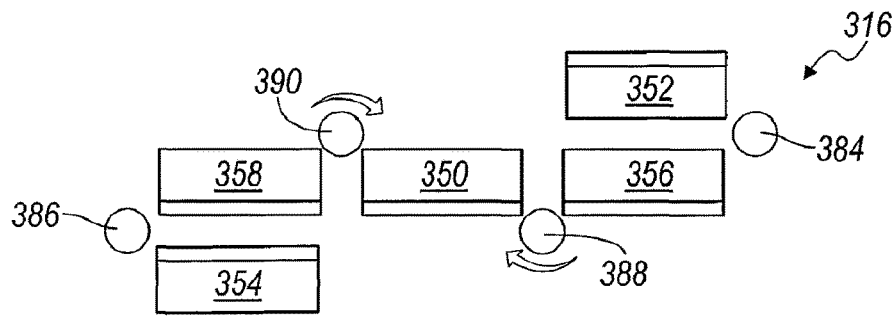
FIG. 14 is another schematic view of the solar collector of FIG. 10, illustrated with a partially expanded PV panel assembly.
Figure 15:
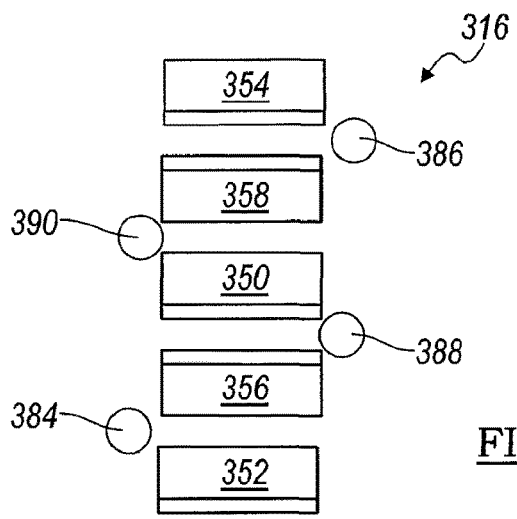
FIG. 15 is yet another schematic view of the solar collector of FIG. 10, illustrated with a closed PV panel assembly.

With reference to FIGS. 13-15, the lower PV panel assembly 316 folds over itself into a closed position for transport. Each panel 366 includes a front surface 380 that is oriented toward the sun to generate electrical energy, and a rear surface 382 opposite the front surface.

According to one embodiment, a first hinge 384 pivotally connects the first outer PV panel 352 to the first inner PV panel 356 about a rear surface 382 of each panel 352, 356. The first outer PV panel 352 folds over the rear surface 382 of the first inner PV panel 356, as illustrated in FIG. 14.

A second hinge 386 pivotally connects the second outer PV panel 354 to the second inner PV panel 358 about the front surface 380 of each panel 354, 358. The second outer PV panel 354 folds over the front surface 380 of the second inner PV panel 358, as illustrated in FIG. 14.

A third hinge 388 pivotally connects the first inner PV panel 356 to the central PV panel 350 about a front surface 380 of each panel 356, 350. The first inner PV panel 356 and the first outer PV panel 352 together fold over the front surface 380 of the central PV panel 350, as illustrated in FIG. 15.

A fourth hinge 390 pivotally connects the second inner PV panel 358 to the central PV panel 350 about a rear surface 382 of each panel 358, 350. The second inner PV panel 358 and the second outer PV panel 354 together fold over the rear surface 382 of the central PV panel 350, as illustrated in FIG. 15.

Figure 16:
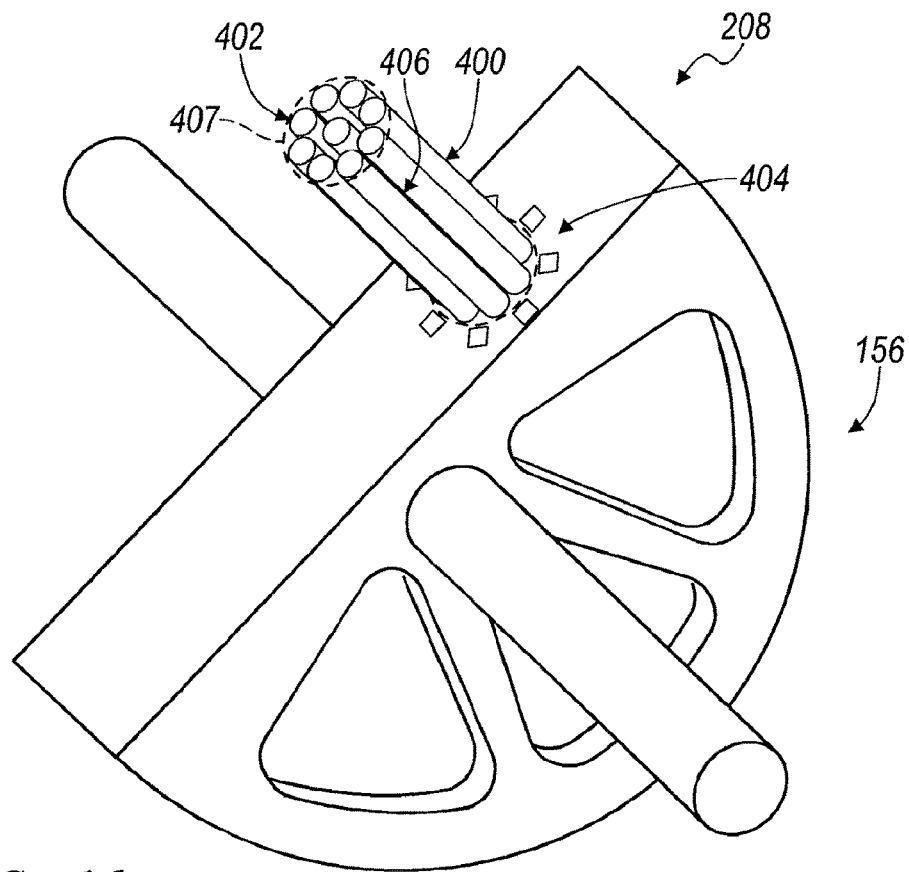
FIG. 16 is a front perspective view of a light sensing device shown mounted on a sector gear.
Figure 17:
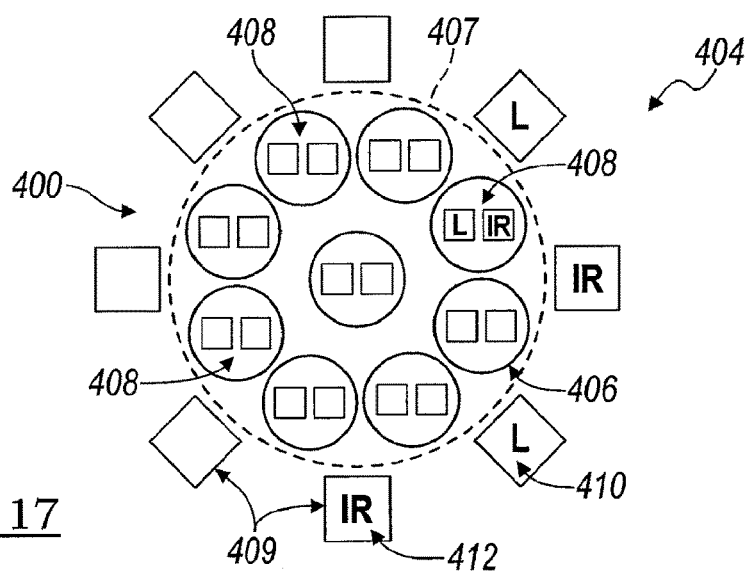
FIG. 17 is a schematic view of the light sensing device of FIG. 16, illustrating a sensor configuration.

With reference to FIGS. 6, 16, and 17, the solar collector 10 includes a solar tracker 208 for monitoring light intensity to determine the position of the sun relative to the current position of the solar collector 10, according to one or more embodiments. Referring to FIG. 16, the solar tracker 208 includes a light sensing device 400 that is disposed on the sector 156. The light sensing device 400 may alternatively be located in other areas on or near the sector 156. The device 400 includes a tube bank 402, and an array of sensors 404 to determine sunlight parameters. The tube bank 402 is comprised of a plurality of individual tubes 406. Each tube 406 has an elongate cylindrical shape and extends transversely from the sector 156. In reference to FIGS. 16 and 17, the tubes 406 are oriented in close proximity to each other, to collectively form a cylindrical post 407, which is shown in phantom view.

Referring to FIG. 17, the array of sensors 404 includes internal sensors 408 that are disposed at the internal base of each tube 406. The elongated tubes 406 shade or block light from reaching the internal sensors 408, when the individual tube 406 is misaligned with the sun. By limiting the amount of light reaching the internal sensors 408 at the bottom of the tubes, the position sensitivity of the light sensing device 400 is increased. The array of sensors 404 also includes external sensors 409 that are disposed at the external base of the post 407. The external sensors 409 are configured to monitor ambient light. A sun intensity value may be determined both for each internal sensor 408, as well as each external sensor 409. Subsequent position adjustments of the solar collector 10 may be used to obtain a maximum cumulative sunlight intensity value for the total of the sensors 408, 409 for a given environmental condition. This allows for a more refined position optimization based on a combination of the amount of sensed sunlight at the base of the tubes 406 and the ambient light conditions.

The array of sensors 404 may also include several types of solar sensors in order to provide comprehensive light sensing in various environmental conditions. For example, FIG. 17 depicts both light sensors 410 and infrared sensors 412 included in the sensor array 404. Multiple sensor types may be employed both in the internal and external sensors 408, 409 disposed at the base of each tube 406.

According to one embodiment, sunlight parameters may be determined based on varying degrees of sunlight received at the array of sensors 404, then the sunlight parameter is communicated to the controller 206 (shown in FIG. 1). The controller 206 may further determine an optimal orientation of solar panels, or position of the solar collector 10 so as to maximize solar energy collection for given environmental conditions.

While embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A solar collector comprising:
   a frame for supporting a plurality of photovoltaic (PV) panels, wherein the frame is adapted to removably attach to a base;
   a first panel assembly, including at least one of the plurality of PV panels, pivotally attached to the frame about a first axis; and
   a second panel assembly, including at least one of the plurality of PV panels, pivotally attached to the first panel assembly to collectively move with the first panel assembly about the first axis and to pivot relative to the frame, and to pivot about a second axis that is substantially parallel to and radially offset from the first axis, to move between a deployed position and a retracted position.

2. The solar collector of claim 1, wherein the first panel assembly is aligned along a first plane and the second panel assembly is aligned along a second plane that is substantially parallel to and spaced from the first plane when the second panel assembly is oriented in the deployed position.

3. The solar collector of claim 2 further comprising a pitch actuator adapted to collectively orient the first axis and second axis to a same pitch angle such that an aspect of the first and second planes is same.

4. The solar collector of claim 2 further comprising, a rotation actuator adapted to collectively orient the first axis and second axis to a same rotational angle such that an aspect of the first and second planes is same.

5. The solar collector of claim 4, wherein the second panel assembly is adapted to align an altitude of the second panel assembly independently from the primary panel to track a sun about the second axis.

6. The solar collector of claim 1, wherein the first panel assembly is aligned along a first plane and the second panel assembly is aligned along a second plane that is substantially perpendicular to the first plane when the second panel assembly is oriented in a retracted position.

7. The solar collector of claim 1, wherein the second panel assembly has a central panel and a first inner side panel pivotally attached to a first lateral edge of the central panel.

8. The solar collector of claim 7, wherein the second panel assembly has a second inner side panel pivotally attached to a second lateral edge of the central panel.

9. The solar collector of claim 8, wherein the second panel assembly is adapted to fold over the central panel into a closed position.

10. The solar collector of claim 1, wherein the first panel assembly has a primary central panel and a first primary inner side panel pivotally attached to a lateral edge of the primary central panel, and the second panel assembly has a secondary central panel and a first secondary inner side panel pivotally attached to a lateral edge of the secondary central panel, and wherein the first panel assembly and secondary panel assembly are adapted to collectively fold into a closed position.

11. The solar collector of claim 1 further comprising, an elongate member that attaches the second panel assembly to the first panel assembly for collective movement.

12. The solar collector of claim 11 further comprising, a translatable strut connecting the first panel assembly and second panel assembly that translates along the elongate member between an extended position and closed position and stiffens the first panel assembly and second panel assembly in the extended position.

13. The solar collector of claim 12, wherein the elongate member has a dog-leg shape such that the second panel assembly stacks with the first panel assembly in a stowed position.

14. The solar collector of claim 13, wherein a pivot of the elongate member is coaxial with the first axis.

15. The solar collector of claim 13, wherein the dog-leg is sized to stack the first panel assembly and second panel assembly in parallel when stowed.

16. The solar collector of claim 15, wherein the base is transportable.

* * * * *